United States Patent [19]
Uehara et al.

[11] 4,208,159
[45] Jun. 17, 1980

[54] APPARATUS FOR THE TREATMENT OF A WAFER BY PLASMA REACTION

[75] Inventors: Akira Uehara, Yokohama; Hisashi Nakane, Kawasaki, both of Japan

[73] Assignee: Tokyo Ohka Kogyo Kabushiki Kaisha, Kawasaki, Japan

[21] Appl. No.: 916,252

[22] Filed: Jun. 16, 1978

[30] Foreign Application Priority Data

Jul. 18, 1977 [JP] Japan .................................. 52-85879
Dec. 31, 1977 [JP] Japan ............................... 52-159798

[51] Int. Cl.² ............................................ B65H 1/06
[52] U.S. Cl. ..................................... 414/225; 118/50; 414/287; 414/404; 414/406; 414/744 B
[58] Field of Search .............. 414/217, 222, 225, 226, 414/287, 152, 157, 159, 173, 180, 186, 209, 210, 211, 214, 744; 118/49, 49.1, 49.5, 50, 50.1

[56] References Cited
U.S. PATENT DOCUMENTS

| 3,874,525 | 4/1975 | Hassan et al. ........................ 414/225 |
| 4,047,624 | 9/1977 | Dorrenbos ............................ 414/217 |

*Primary Examiner*—Robert G. Sheridan
*Attorney, Agent, or Firm*—Brisebois & Kruger

[57] ABSTRACT

An improved apparatus for the automatic handling of wafer materials is proposed for the plasma treatment of the wafers such as high-purity silicon semiconductor wafers. In this apparatus, the wafer carried by a carrier means to a position neighboring to a wafer table is picked up by a movable pick-up means and placed on the wafer table where it is subjected to the plasma treatment after the wafer table is fixed vacuum-tightly to a plasma reaction chamber. After completion of the treatment, the wafer is taken out by a second movable pick-up means and carried away by another carrier means to the succeeding processing step. Thus a possibility of full automatization of wafer processing is provided.

3 Claims, 9 Drawing Figures

APPARATUS FOR THE TREATMENT OF A WAFER BY PLASMA REACTION

BACKGROUND OF THE INVENTION

The present invention relates to a novel precision apparatus for the treatment of a wafer material by low-temperature gas plasma reaction provided with an automatic handling mechanism of the wafer.

Recent development in electronics industry is very remarkable and the processing technology of electronic parts such as in transistors, ICs, LSIs, super-LSIs and the like is also rapidly growing. In the photo-fabrication of semiconductor substrate as a typical one of such processing technologies, for example, it is a general trend in etching treatment that a dry-etching process by use of a gas plasma is becoming more and more prevalent replacing the conventional wet-etching process by use of an etching solution. Even when a wet-etching process is undertaken for the precision fabrication of a wafer material, a pretreatment by plasma reaction is recommended for improving the wettability of the surface.

All of the prior art apparatuses for such a gas plasma treatment of wafers are designed for batch-wise operation. For example, 10 to 25 wafers in vertical positions mounted on a wafer stand are placed in a plasma reaction tube, the reaction tube is evacuated and filled with the plasma gas, plasma is generated by applying an electric voltage to effect desired etching and the wafers are taken out of the reaction tube as held on the wafer stand.

One of the major problems in the batch-wise apparatus of the prior art as above is the unevenness of the plasma reaction. Namely, etching with the plasma gas can never be very even on all of so many numbers of the wafers positioned over considerable length in the reaction tube bringing about 10% or more of unevenness in the etching by the plasma reaction. Inspite of the efforts to mitigate such an unevenness by the improvement in the shapes of the reaction tubes and the conditions of the reaction, no satisfactory results have been hitherto obtained.

In the batch-wise apparatuses of the prior art in general, on the other hand, the wafers to be treated are sent from the preceding treatment process as mounted on a wafer cassette, from where they are picked up one by one manually with tweezers and mounted on a wafer stand to be placed in the reaction tube. After completion of the plasma treatment, the wafers are again handled manually to be mounted on another wafer cassette to be sent to the succeeding process. It is a large problem in this manner of manual handling in the plasma treatment process that the full automatization in series of the whole wafer processing procedure is heavily interrupted by this plasma treatment step whereas the wafer cassette can be run through all of the other process steps such as coating of the photoresist, exposure to light, development and rinsing. What is still worse, the wafers thus handled manually with tweezers are sometimes marred by scratching or even cracked. A difficulty should also be taken into consideration that large-sized wafers cannot be held with tweezers as in the recent trend that larger and larger wafers are coming into current.

SUMMARY OF THE INVENTION

It is therefore an object of the present invention to present a possibility of automatizing the process of plasma treatment of wafers by eliminating the manual handling in the prior art.

The apparatus of the invention comprises the elements of
(a) a reaction chamber with an opening in the bottom,
(b) a wafer table for mounting a wafer positioned beneath the opening of the reaction chamber and capable of vertical movement relative to the reaction chamber, which is fixed vacuum-tightly to the opening of the reaction chamber when it is in the uppermost position but leaving a sufficient clearance with the plasma reaction chamber for the entering of the undermentioned pick-up in between when it is in this lowermost position,
(c) an in-take carrier means for bringing the wafer to a neighboring position to the wafer table,
(d) an in-take pick-up means for picking up the wafer from the in-take carrier means and placing the same on to the wafer table,
(e) a take-out pick-up means for picking up the wafer from the wafer table and bringing the same out from beneath the reaction chamber,
(f) a take-out carrier means for receiving the wafer carried by the take-out pick-up means, and
(g) a control means for driving the components (a) to (f) in linkage motion.

DETAILED DESCRIPTION OF THE PREFERRED EMBODIMENTS

Figure 1:
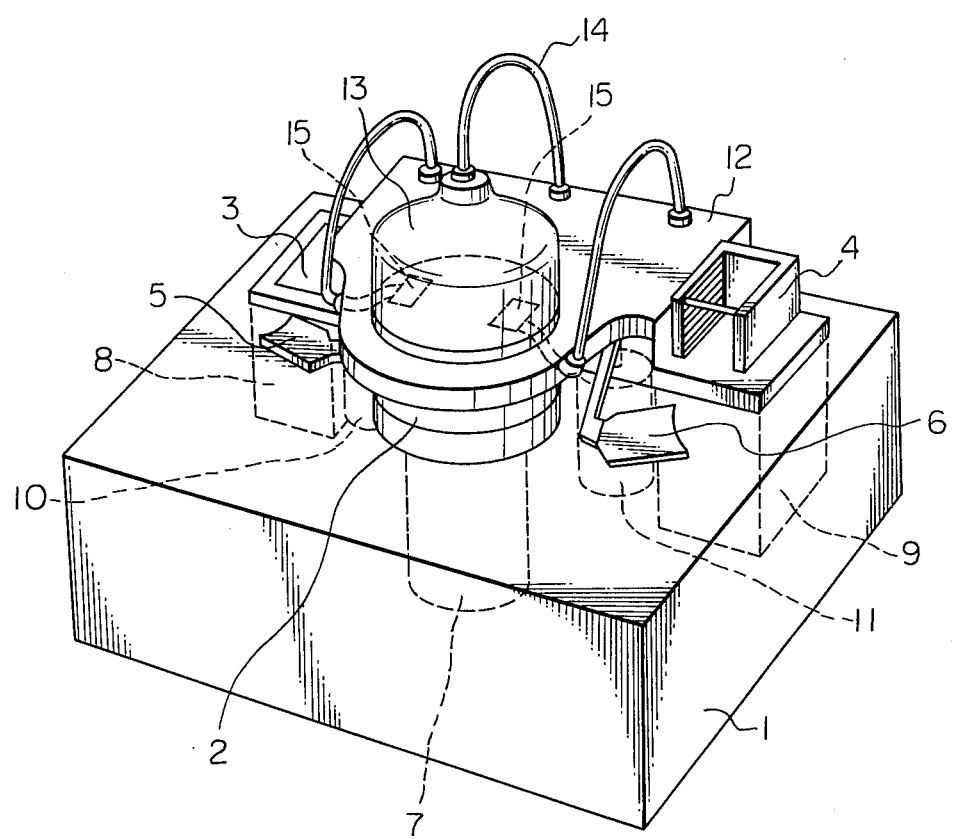
FIG. 1 is a perspective view of the revolving-arm type apparatus of the invention.

The novel and improved apparatus of the invention for plasma treatment of wafer materials is now described in detail with reference to the drawing.

FIG. 1 is a perspective view of the apparatus as an embodiment of the invention, in which 1 is a base table of boxtype, mounting on its top a wafer table 2 fixed on an elevator cylinder 7 installed inside the base table 1 so that the wafer table 2 is capable of being moved up and down. A wafer cassette 3 is mounted on the cassette elevator 8 for the step-wise upward motion of the wafer cassette 3 by a height equal to the thickness of the wafer one by one, which serves as a carrier means for bringing the wafer to a neighboring position to the wafer table 2. An in-take pick-up 5 is provided on the top of the base table 1 so as to be revolvable around an axis by being driven by a pick-up driving unit 10, which serves for picking up the wafer from the wafer cassette 3 and placing the wafer on the wafer table 2. On the side position of the wafer table 2 to the pick-up 3 is provided another pick-up 6 also revolvable around an axis by being driven by another pick-up driving unit 11, which serves for picking up the wafer on the wafer table 2 and bringing the wafer out off the top of the wafer table 2. Near to the take-out pick-up 6, another wafer cassette 4 is provided on top of the second cassette elevator 9 so that the wafer cassette 4 is capable of step-wise downward motion by a height equal to the thickness of the wafer, which serves for receiving the wafers brought by the pick-up 6. The purpose of the step-wise upward or downward motion of the cassette elevator 8 or 9 is that the position of the wafer on the top of the wafers stacked in the wafer cassettes is always at a constant level suitable for being picked up by the in-take pick-up 5 or for receiving the next wafer brought in by the take-out pick-up 6 when the number of the wafers in each of the wafer cassettes decreases or increases one by one.

Above the wafer table 2 is provided a plasma reaction chamber 13 of dome-like form fixed to the base plate 12 over the base table 1.

Connected to the top of the reaction chamber 13 is an evacuation duct 14 leading to a vacuum pump (not shown) installed inside the base table 1 and two gas nozzels 15, 15 have openings inside the reaction chamber 13 from which the plasma gas is introduced into the chamber 13.

Figure 4:
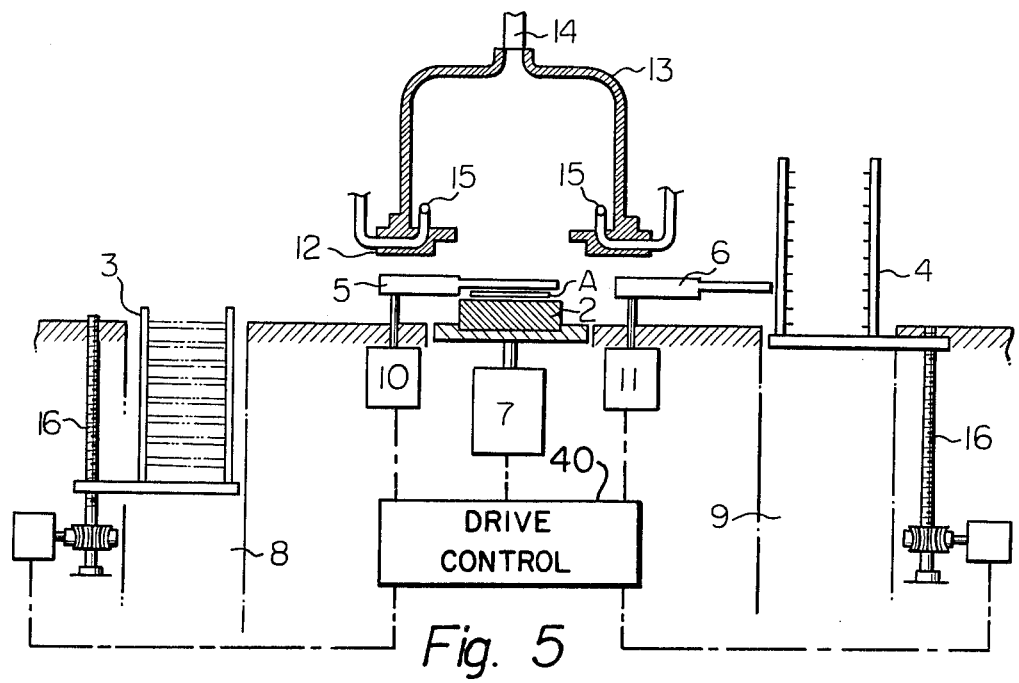
FIG. 4 is a cross sectional front view of the apparatus of the invention with the wafer table at the lowermost position.

The mechanism for driving the cassette elevator 8 in step-wise motion upwardly is rather conventional in machinery engineering and not limited to any specific type. An example of such a mechanism is seen in FIG. 4 showing the cross-sectional front view of the apparatus in which the cassette elevator 8 is supported by a screw 16 in upright position driven by a worm wheel rotated by a motor in such a manner that a predetermined number of revolution of the worm wheel leads to the elevation of the cassette elevator 8 by a height equal to the thickness of the wafer mounted on the wafer cassette 3. The mechanism for the step-wise downward motion of the cassette elevator 9 is just the same.

Figure 2:
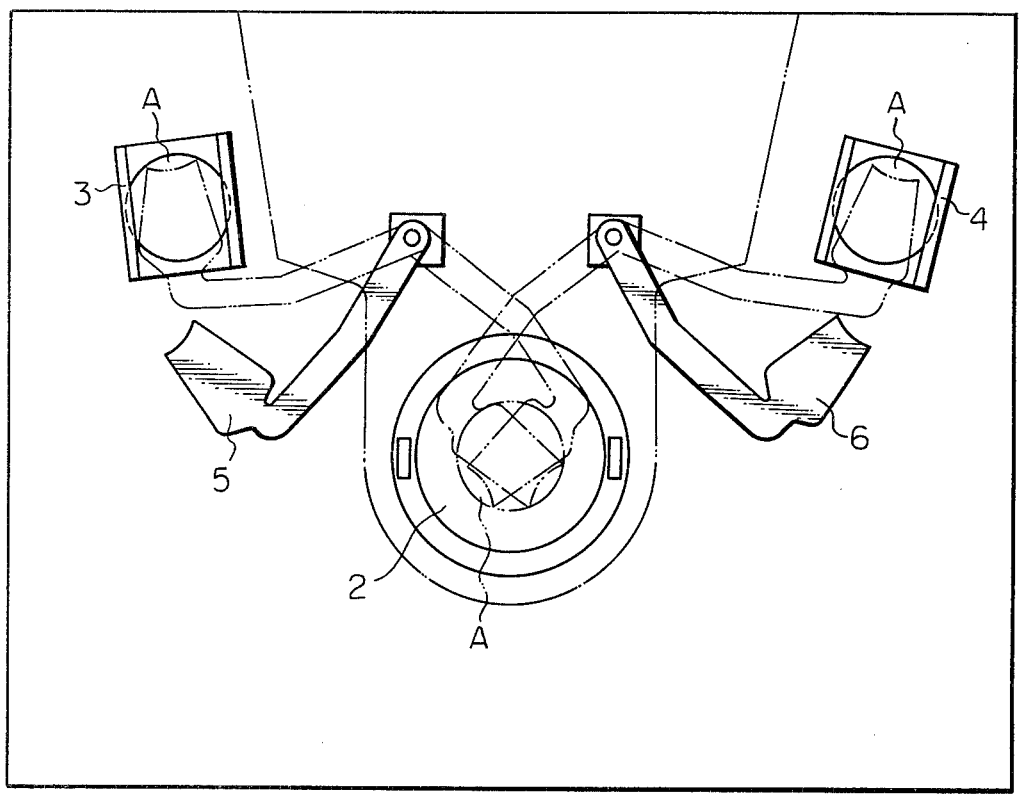
FIG. 2 is a plan view of the revolving-arm type apparatus of the invention.

As is shown in FIG. 2 showing a plan view of the apparatus, the pick-ups 5 and 6 are each movable back and forth between the two extreme positions shown by the chained lines, on one extremity positioned above the wafer table 2 and on the other extremity positioned above the wafer cassette 3 or 4, respectively, by being driven with the motors in the pick-up driving units 10 or 11, respectively. When these pick-ups 5 and 6 are not in motion, they are held at the positions shown by the solid lines in FIG. 2.

Figure 3:
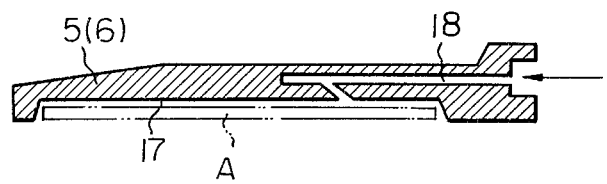
FIG. 3 is a cross section of the pick-up head used in the apparatus of the invention.

FIG. 3 is a cross section of the wafer holding head of the pick-up 5 or 6 mounted on the end of the revolving arm. The principle of the pick-up for holding a wafer is well known belonging to an air-flow type pick-up having a recess 17 on the underside with a dimension to fit the wafer to be held therein and a stream of pressurized air flows through the gas passage 18 to form a horizontal air flow within the recess 17. By this means a floating force is exerted to the wafer as a vertical component of the air flow to hold the wafer within the recess 17 with a backside gap of about 0.5 mm.

The linkage motion of the individual parts of the inventive apparatus as described above is now explained in turn.

(1) The in-take pick-up 5 revolves clock-wise from the position shown by the solid line in FIG. 2 to the extreme position shown by the chained line above the wafer cassette 3.

(2) Pressurized air is blown into the gas passage 18 of the pick-up 5 to suck a wafer A from the top of the wafer stack mounted on the wafer cassette 3 into the recess 17.

(3) The pick-up 5 revolves counterclock-wise to the other extreme position shown by the chained line above the wafer table 2 in its lowermost position and stops there with the wafer a held in the recess 17.

(4) The supply of the pressurized air into the pick-up 5 is stopped to release the wafer A held in the recess 17 which is placed on the wafer table 2 as shown in FIG. 4.

(5) The pick-up 5 revolves clock-wise to return to the original position shown by the solid line in FIG. 2 and stops there.

(6) The wafer table 2 is elevated by the action of the elevator cylinder 7 to be fixed vacuum-tightly to the underside opening of the plasma reaction chamber 13.

Figure 5:
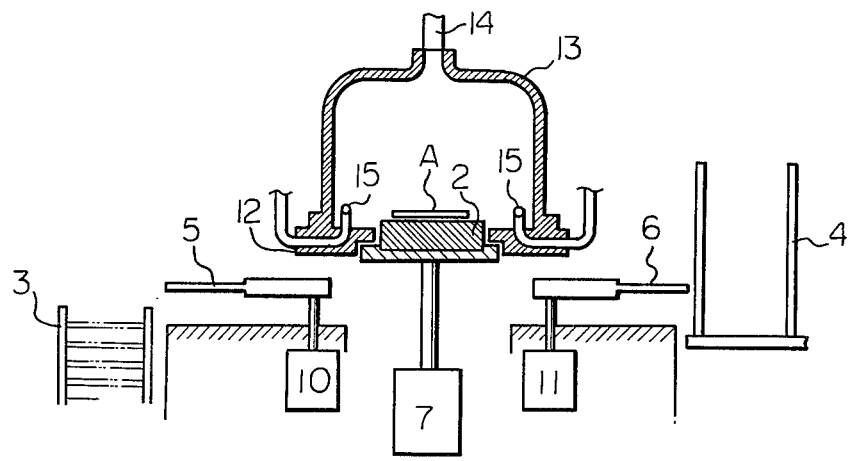
FIG. 5 is a cross sectional front view of the apparatus of the invention with the wafer table at the uppermost position.

(7) The treatment of the wafer A with the plasma reaction is carried out by successively evacuating the reaction chamber 13 with a vacuum pump, introducing a plasma gas, e.g. fluorinated hydrocarbon gas, through the gas nozzles 15, 15 and applying a high voltage to effect etching, removal by ashing, surface cleaning and the like as in a conventional treatment while the wafer table 2 is heated by some built-in heater means to an elevated temperature, say, 150° C., to shorten the time necessary for the treatment as shown in FIG. 5.

(8) After completion of the treatment, the gas supply and application of the high voltage become off and the pressure inside the reaction chamber 13 is increased to atmospheric pressure.

(9) The wafer table 2 is lowered by the downward motion of the elevator cylinder 7.

(10) The take-out pick-up 6 revolves clock-wise from the position shown by the solid line in FIG. 2 to the position above the wafer A on the wafer table 2 shown by the chained line in FIG. 2.

(11) The wafer A is sucked by the pick-up 6 by supplying pressurized air to the pick-up 6 as in the in-take pick-up 5.

(12) The pick-up 6 revolves counterclock-wise to the position above the wafer cassette 4 shown by the chained line in FIG. 2 where the supply of the pressurized air is stopped to release the wafer A to the wafer cassette 4.

(13) The pick-up 6 returns to the original position shown by the solid line in FIG. 2.

(14) Within the period of the above steps (3) to (13), the wafer cassette 3 is elevated with the cassette elevator 8 by a height equal to the thickness of the wafer stacked on it so that the wafer to be picked up next comes to a height suitable for being sucked by the in-take pick-up 5.

(15) Similarly the wafer cassette 4 is lowered with the cassette elevator 9 by a height equal to the thickness of the wafer so that the wafer next coming is readily received by the cassette 4.

All of the above movements of the individual parts must be in linkage motion and the stroke velocity of the sequential linkage motion is adjustable within certain range so as that the time for the plasma treatment can be extended or shortened according to need.

The control means 40 (FIG. 5) for bringing the individual parts into harmonized linkage motion may be a programmed control means well known in the control of verious kinds of machine tools for automatic machining. For example, each of a plurality of cams fixed to a revolving shaft serves to start and stop the motion of one of the individual parts in a predetermined schedule. Alternatively the linkage motion can be controlled by a series of electric relays.

Figure 6:
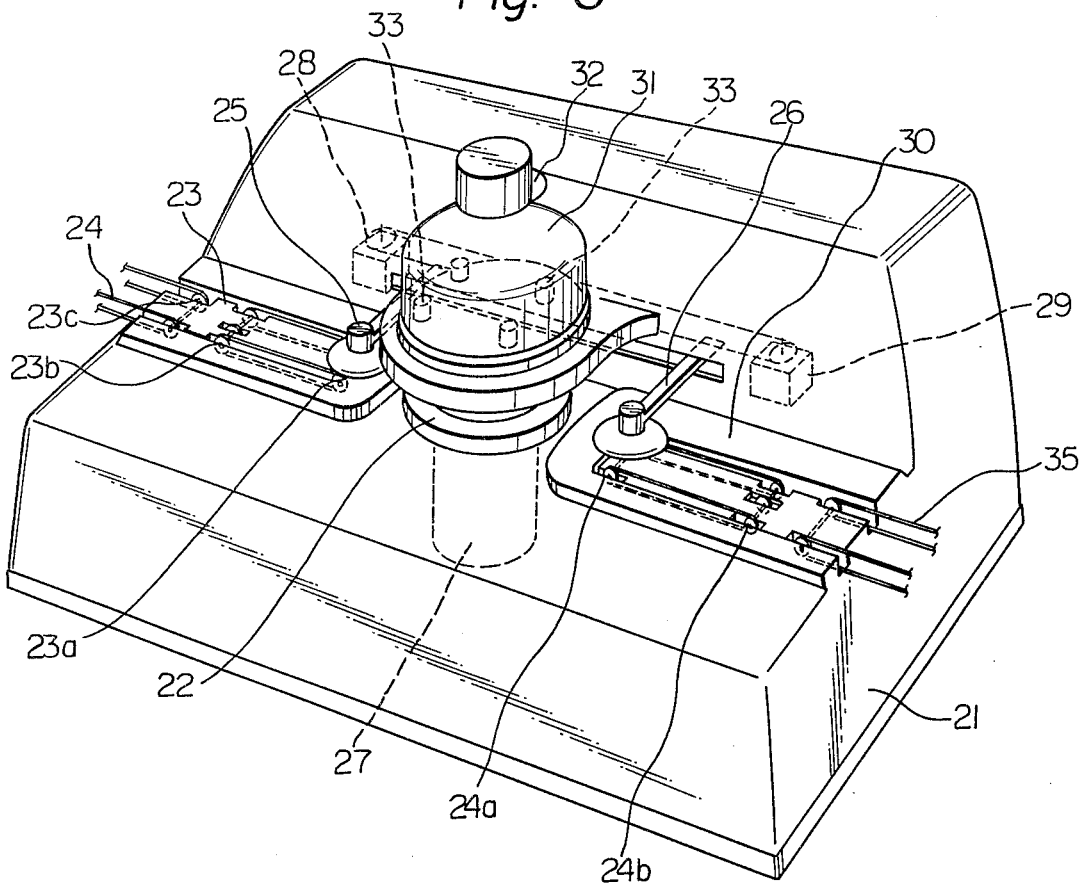
FIG. 6 is a perspective view of the parallel running-arm type apparatus of the invention.

FIG. 6 is a perspective view of a further improved embodiment of the present invention in which the pick-ups move along a straight line being supported by respective arms running along parallel lines instead of the revolving arms in the above described embodiment. By such a disposition of the pick-up movement, advantages are obtained in that the number of broken wafers can be further reduced and, in addition, the wafer cassettes can be eliminated so as that the direct connection of the apparatus from the conveyor means from the preceding process step or to the conveyor means to the succeeding process step is obtained such that the full automatization of the wafer processing processes in series can be established.

Figure 7:
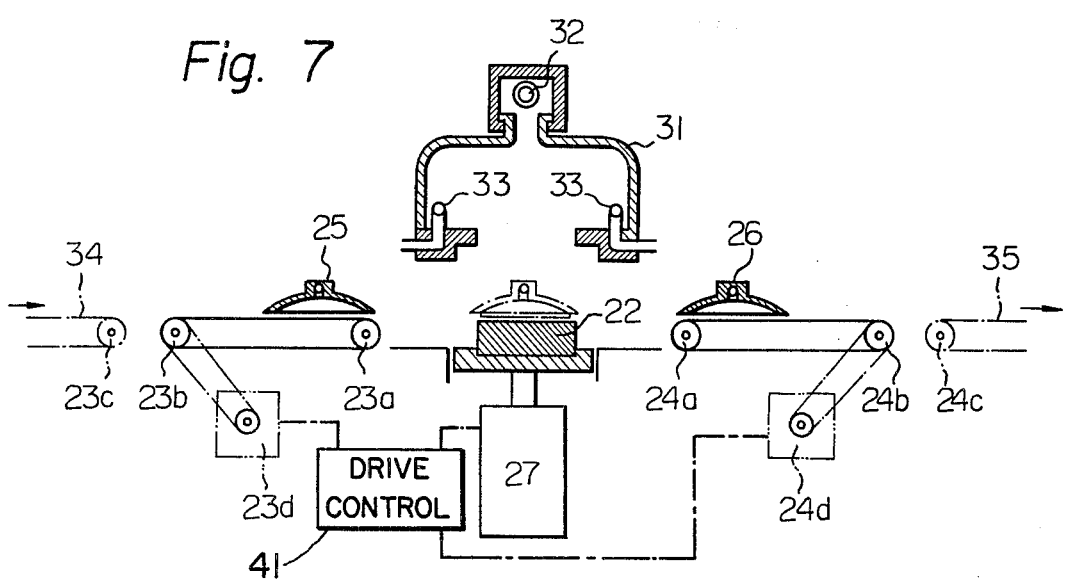
FIG. 7 is a cross sectional front view of the parallel running-arm type apparatus of the invention with the wafer table at the lowermost position.
Figure 8:
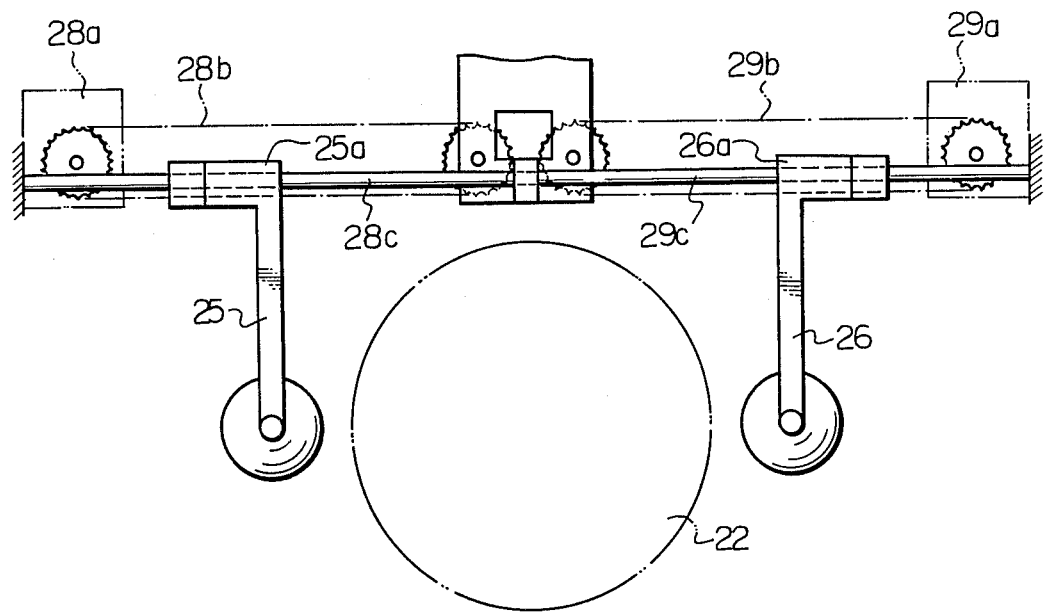
FIG. 8 is a schematic plan view of the pick-up driving mechanisms of the parallel running-arm type apparatus of the invention.
Figure 9:
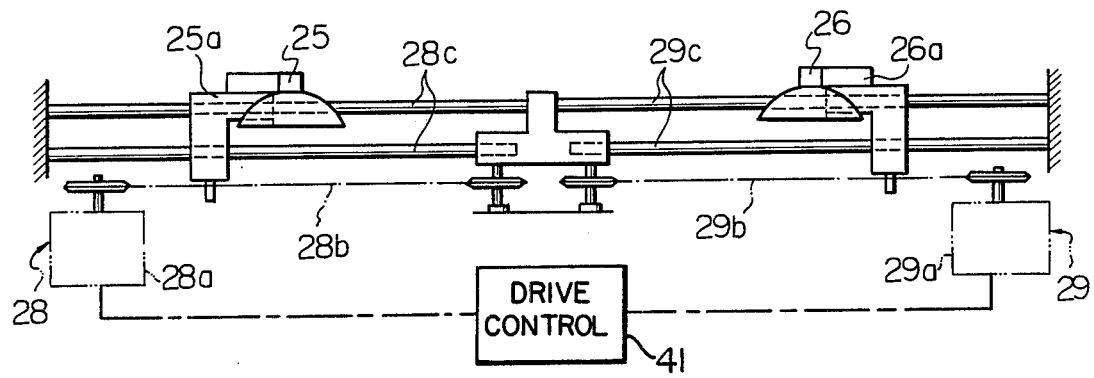
FIG. 9 is a schematic front view of the pick-up driving mechanism in the parallel running-arm type apparatus of the invention.

The construction of this further improved embodiment of the inventive apparatus is now explained in detail with reference to FIGS. 6 to 9. In FIG. 6, 21 is a base table of box type, on top of which an in-take wafer carrier 23 and a take-out wafer carrier 24 are provided and a wafer table 22, an in-take pick-up 25 and a take-out pick-up 26 are provided by being mounted on an elevator cylinder 27 or at the ends of the moving arms driven by the pick-up driving units 28 and 29, respectively. A plasma reaction chamber 31 is positioned above the wafer table 22 fixedly supported by a base table 30 of shelf-like form connected to the base table 21 at the upper part of it. In connection to the plasma reaction chamber 31 is provided an evacuation duct 32 leading to a vacuum pump (not shown) installed inside the base table 21 and several gas nozzles 33, 33 have openings inside the plasma reaction chamber 31. 23a is a conveyor driven by the pulleys 23b, 23b for bringing the wafer received from a belt conveyor 34 driven by the pulleys 23c, 23c into the neighboring position to the wafer table 22. In a symmetrical position of the above in-take conveyor means relative to the wafer table 22 is provided a take-out conveyor means composed of a conveyor 24a driven by the pulleys 24b, 24b for bringing the wafer brought by the take-out pick-up 26 to a belt conveyor 35 driven by the pulleys 24c, 24c for carrying the wafer to the succeeding process step. As is shown in FIG. 7, these conveyors 23a and 24a are driven by separate motors 23d and 24d installed inside the base table 21. The conveyor 23a receives the wafer from the belt conveyor 34 and carries it to beneath the in-take pick-up 25 at the neighboring position to the wafer table 22. The conveyor 24a receives the wafer taken out from the wafer table 22 by the take-out pick-up 26 and transmits it to the belt conveyor 35. The pick-ups 25 and 26 connected to the endless chains 28b and 29b at the ends 25a and 26a move back and forth along the guide rails 28c and 29c by being driven by the reversible motors 28a and 29a installed inside the pick-up driving units 28 and 29 between the extreme positions, one being the position shown by the solid lines in FIGS. 7 to 9, respectively, and the other being the position shown by the chained lines in FIG. 7 just covering the wafer table 22. The positions of the pick-ups 25 and 26 as shown by the solid lines in FIG. 7 are the positions where the pick-ups are located when they are not in motion. Each of the pick-ups 25 and 26 has a cup-shaped sucking disc at the end of the arm and the wafer is held by the sucking disc connected to a vacuum pump which may be the same one that is used for evacuating the plasma reaction chamber 31. As is shown in FIGS. 8 and 9, the ends 25a and 26a of the arms of the pick-ups 25 and 26 are connected to the endless chains 28b and 29b running right and left by being driven by the reversible motors 28a and 29a enabling the sliding motion of the arm ends 25a and 26a along the guide rails 28c and 29c fixed to the base table 21.

The linkage motions of the individual parts of the parallel running-arm type apparatus as described above are similar to those in the revolving-arm type apparatus previously descirbed. As is shown in FIG. 7, the in-take conveyor 23a running to the right receives a wafer from the belt conveyor 34 and carries it to the position beneath the in-take pick-up 25 in the neighboring position to the wafer table 22. The wafer is sucked by the sucking disc at the end of the arm of the in-take pick-up 25 and carried to the position just above the wafer table 22 where it is released from the sucking disc and drops on to the wafer table 22. The in-take pick-up 25 returns to its original position.

The movement of the wafer table 22 and the process of the plasma reaction are the same as described for the revolving-arm type apparatus.

After completion of the wafer treatment by plasma reaction, the wafer table 22 is lowered and the wafer is taken out by the take-out pick-up 26, carried to the right by the conveyor 24 and transmitted to the belt conveyor 35 to be transferred to the succeeding process step.

The control means 41 (FIGS. 7 and 9) for the linkage motion of the individual parts may be a similar one to that in the revolving-arm type apparatus operated by mechanical cams or by a series of electric relays.

Various alternatives are possible in the above described apparatus. For example, the conveyors may be a belt conveyor, a wire conveyor, an air-roll conveyor and the like or any other conveying means. Further, the conveyors may be replaced with wafer cassettes as described in the revolving-arm type apparatus though it is more advantageous that the parallel running-arm type apparatus is built into a full automatic line for the wafer processing.

The advantages obtained by the apparatuses of the present invention constructed and operated as described above are that:

(1) the wafer processing process can be fully automatized with complete elimination of the manual handling as a step of the continuous process resulting in high productivity as well as the remarkably decreased loss of the wafers by scratching or breaking;

(2) the treatment of the plasma reaction is very reliable to the same extent as in the manual handling because the same sequential linkage motion is undertaken by the individual parts of the apparatus with the reaction chamber closed gas-tightly for wafers one by one; and (3) the unevenness in the plasma treatment of the wafers which is inevitable in the manual handling can be minimized because the treatment conditions, e.g. treatment time, introduction of the plasma gas, degree of the vacuum inside the reaction chamber, temperature and the like are strictly controlled within very narrow ranges by means of electric relay systems so that the precision works for the manufacture of super-LSIs can be satisfactorily performed.

What is claimed is:

1. An apparatus for the treatment of a wafer by plasma reaction which comprises the components of
   (a) a reaction chamber with an opening in the bottom,
   (b) a wafer table for mounting a wafer positioned beneath the opening of the reaction chamber and capable of vertical movement relative to the reaction chamber to be fixed vacuum-tightly to the reaction chamber at the uppermost position,
   (c) an in-take carrier means for carrying the wafer to a neighboring position to the wafer table,
   (d) an in-take pick-up means for picking up the wafer from the in-take carrier means and placing the same on to the wafer table,
   (e) a take-out pick-up means for picking up the wafer from the wafer table and bringing the same out from beneath the reaction chamber,
   (f) a take-out carrier means for receiving the wafer carried by the take-out pick-up means, and
   (g) a control means for driving the components (a) to (f) in linkage motion.

2. The apparatus as claimed in claim 1 wherein the in-take pick-up means is fixed on a revolving arm whereby to be able to move back and forth between two extremities positioned, in one extremity, above the in-take carrier means and, in the other extremity, above the wafer table and the take-out pick-up means is fixed on another revolving arm whereby to be able to move back and forth between two extremities positioned, in one extremity, above the wafer table and, in the other extremity, above the take-out carrier means.

3. The apparatus as claimed in claim 1 wherein the in-take pick-up means is fixed on an arm movable along a straight line whereby to be able to move back and forth between two extremities positioned, in one extremity, above the in-take carrier means and, in the other extremity, above the wafer table and the take-out pick-up means is fixed on an arm movable along a straight line whereby to be able to move back and forth between two extremities positioned, in one extremity, above the wafer table and, in the other extremity, above the take-out carrier means.

* * * * *